(12) United States Patent
Kadirvel et al.

(10) Patent No.: US 10,211,653 B2
(45) Date of Patent: Feb. 19, 2019

(54) DYNAMIC BATTERY CELL IMPEDANCE MONITORING

(71) Applicant: Apple Inc., Cupertino, CA (US)

(72) Inventors: Karthik Kadirvel, San Jose, CA (US); Ankur Gupta, Redwood City, CA (US); Hua Chen, Santa Clara, CA (US); Christopher C. Branson, San Jose, CA (US); David M. DeMuro, San Jose, CA (US); Alessandro Pelosi, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/650,888

(22) Filed: Jul. 15, 2017

(65) Prior Publication Data

US 2018/0254641 A1   Sep. 6, 2018

Related U.S. Application Data

(60) Provisional application No. 62/465,658, filed on Mar. 1, 2017.

(51) Int. Cl.
  *H01M 10/42* (2006.01)
  *H02J 7/00* (2006.01)
  *G01R 31/36* (2006.01)

(52) U.S. Cl.
  CPC ........ *H02J 7/0026* (2013.01); *G01R 31/3658* (2013.01); *G01R 31/3662* (2013.01); *H02J 7/008* (2013.01)

(58) Field of Classification Search
  CPC .................................................... H01M 10/42
  See application file for complete search history.

(56) References Cited

U.S. PATENT DOCUMENTS

2012/0306506 A1*  12/2012  Kiuchi .............. G01R 31/3658
                                                       324/434
2013/0030596 A1*   1/2013  Okada ............... G01R 31/3651
                                                       700/297

* cited by examiner

*Primary Examiner* — Jacob B Marks
(74) *Attorney, Agent, or Firm* — Kilpatrick Townsend & Stockton, LLP

(57) ABSTRACT

Battery packs that include multiple battery cells that may be monitored using a reduced amount of circuitry and battery systems that may account for battery cell changes over aging and temperature.

20 Claims, 12 Drawing Sheets

DYNAMIC BATTERY CELL IMPEDANCE MONITORING

CROSS-REFERENCES TO RELATED APPLICATIONS

This application claims the benefit of U.S. provisional patent application No. 62/465,658, filed Mar. 1, 2017, which is incorporated by reference.

BACKGROUND

Battery-powered electronic devices have become a ubiquitous staple of life. Electronic devices, such as smart phones, tablets, laptops, flashlights, keyboards, mice, headphones, and other portable devices are used on a regular basis, and as a result, need to be charged regularly. One attendant result is a demand by users for longer battery life in these devices. Another is the demand by users for a shortened charging time.

But non-optimal charging may lead to a shortened life span for batteries. Typically, charging a battery too fast, or overcharging a battery, may lead to a shorter useful battery lifespan. The effects of overcharging may become more pronounced as the battery ages, or is exposed to increased temperatures. Thus, it may be beneficial to monitor and optimize this charging. Being able to monitor and optimized charging with a reduce amount of circuitry may save resources and reduce power dissipation.

These electronic devices are also becoming smaller. This reduction in form places a premium on space inside these devices. The need to optimally locate and position each component in an electronic device becomes paramount.

In some circumstances, the space inside an electronic device that may be available for a battery is not optimal for a single battery. This may be due to the space available for a battery being non-contiguous. The non-optimization of space inside an electronic device may also be caused by the available space not easily corresponding to the space consumed by a commercially available battery. For these and other reasons, multiple battery cells may be used in an electronic device.

Thus, what is needed are battery systems that may monitor multiple battery cells using a reduced amount of circuitry and that may account for battery cell changes over aging and temperature.

SUMMARY

Accordingly, embodiments of the present invention may provide battery packs that include multiple battery cells that may be monitored using a reduced amount of circuitry and battery systems that may account for battery cell changes over aging and temperature. An embodiment of the present invention may provide a battery pack having a reduced amount of circuitry by sharing a single gas gauge among multiple battery cells in a battery pack. This may be in contrast to conventional battery packs where each battery pack includes a single battery cell monitored by its own gas gauge. These and other embodiments of the present invention may provide battery systems that may account for battery cell changes over aging and temperature by measuring battery cell impedance while the battery cell is in place and operational in an electronic device. The calculated impedance values may be used in adjusting charging algorithms for the purpose of achieving one or more goals, such as maintaining charging time over a battery cell life, extending the lifetime of a battery cell, and others. Battery packs and battery systems provided by embodiments of the present invention may reduce power dissipation and conserve resources.

These and other embodiments of the present invention may provide a battery pack having multiple battery cells, where the individual battery cells are protected by corresponding protection circuits, one or more battery cells are monitored by current sense circuits, and the battery pack as a whole is monitored by a gas gauge. The gas gauge may monitor current into and out of the battery pack, as well as battery pack voltage and temperature. Current sense circuits may be placed in series with all but one of the battery cells in the battery pack. In a battery pack having N battery cells, a current sense circuit may be placed in series with N−1 battery cells, while no current sense circuit is used for the Nth battery cell. The total current into the N battery cells can be read from the gas gauge, and the current into the N−1 battery cell can be read individually from the current sense circuits and subtracted from the total, such that the current into the Nth battery cell is the remainder. In a battery pack with two battery cells, a current sense circuit may be placed in series with a first battery cell, while no current sense circuit is used for the second battery cell. The total current into both battery cells can be read from the gas gauge, the current into a first battery cell can be read from the current sense circuit, and the current into the second battery cell can be calculated from the difference between these values. In this way, currents into the battery cells may be monitored using a reduced amount of circuitry. This may reduce power dissipation and save resources.

These and other embodiments of the present invention may provide battery systems that may dynamically calculate battery cell impedance while the battery cell is in place and operational in an electronic device. For example, a current into a battery cell may be set to a first current and a first voltage may be measured by circuitry in a battery pack. The current into the battery cell may be changed to a second value and a second voltage may be measured. The impedance may be calculated by dividing the difference between the first and second voltage by the difference between the first and second currents. This calculation may be done by a logic circuit such as a system microcontroller. This logic circuit may be external to the battery pack, though it may be included in the battery pack as well. As another example, a charging circuit that provides current to the battery pack may be disabled. A first current in the battery cell and a first voltage of the battery cell may be measured by circuitry in the battery pack. The charger may then provide a second current and a resulting second voltage may be measured. The impedance may be calculated by the logic circuit by dividing the difference between the first and second voltage by the difference between the first and second currents.

The calculated battery cell impedances may be used for various purposes. For example, on occasion, a battery cell may become partially disconnected or otherwise become nonfunctional. This may occur due to overvoltage, overcurrent, excessive temperature or pressure, and other fault conditions. Also, a battery cell may become physical disconnected. These and other conditions may be detected by measuring a large increase in battery cell impedance. In such an event, charging current into or out of the battery pack may then be limited to the charge or discharge current supported by the remaining battery cells.

In these and other embodiments of the present invention, an exit from such a fault condition may be determined. Once the exit from the fault condition has been detected, normal operation of the battery system may resume. Where a physical disconnection has occurred, the fault condition may not be exited. When a fault state persists beyond a set duration, the user may be notified that a battery pack repair or replacement may be required.

In these and other embodiments of the present invention, calculated battery cell impedances may be compared to an expected profile of impedance as a function of age and temperature. If the calculated battery cell impedances depart significantly from the expected profile, the user may be notified that a battery pack replacement or repair may be needed.

In these and other embodiments of the present invention, the algorithms used to charge battery cells may be varied. These algorithms may be varied based upon changes in battery cell impedance, cycling history, temperature, pressure, and other factors.

In these and other embodiments of the present invention, charging time may be maintained as a battery cell ages and calculated battery cell impedance increases. For example, a charging voltage target may be lowered. The charging current may be raised to maintain a constant charging time. The termination voltage where fast charging ends may be alternatively modified as well. For example, it may be reduced to a lower voltage.

In these and other embodiments of the present invention, changes to the charging algorithm may be made by the battery system to improve battery life. That is, impedance changes with age and temperature may be accounted for in a charging algorithm in order to lengthen the useful life of the battery cell. For example, as a battery cell ages, the maximum charged voltage or charging voltage target may be reduced in order to preserve the battery cell. The charging current may be lowered or otherwise adjusted based on battery cell impedance, age, and temperature to reduce stress on the battery cell. The termination voltage where fast charging ends may be alternatively modified as well. For example, it may be reduced to a lower voltage.

In these and other embodiments of the present invention, the battery cells may have different charge or chemical capacities, form factors, resistances, or other characteristic or combination thereof.

Various circuit configurations may be used for battery packs in these and other embodiments of the present invention. In one example, each battery cell may be connected to a first end of a control path, the second end of which may be connected to the gas gauge and protection circuit. Each control path may include a charge transistor that may close to allow, or open to prevent, charging of a battery cell, a discharge transistor that may allow or prevent discharging of a battery cell, and a current sense resistor. The charge and discharge transistors may be under the control of charge and discharge control outputs provided by a protection circuit. The charge transistors in each control path may have control electrodes, such as a gate, that are connected to the charge control output of their respective protection circuit. The discharge transistors in each control path may have control electrodes, such as a gate, that are connected to the discharge control output of their respective protection circuit. The sense resistor may be coupled to the protection circuit as well, and the protection circuit may detect over current conditions by comparing a voltage across the sense resistor to a threshold voltage. In these and other embodiments of the present invention, a current sense circuit may optionally be connected to a sense resistor in one or more control paths to measure a current into or out of its corresponding battery cell.

The gas gauge may monitor the current, temperature, and voltage of the battery pack. If an excess current is entering the battery pack, the gas gauge may send a signal to a system microcontroller or current limiter to reduce the total current into the battery pack.

In these and other embodiments of the present invention, a protection circuit may measure the voltage and current for each battery cell to determine whether an under voltage or under current condition exists. This determination may be made by comparing a voltage or current to a limit, where the limits may be the same or different for each battery cell. If such a condition exits, the discharge control output of the protection circuit may change state, thereby turning off each of the discharge transistors and preventing further discharging of each of the battery cells. Each of the discharge transistors may be oriented in such a way that their body diodes provide a charge path through the battery cells when discharging is disabled.

These and other embodiments of the present invention may further include temperature sensors either in or related to the protection circuits or the gas gauge. These temperature sensors may be placed on or near the battery cells or other battery system components. These temperature sensors may detect excessive temperatures (either high or low, or both) and prevent further charging, discharging, or both of their corresponding battery cells until temperatures return to an acceptable range.

These and other embodiments of the present invention may further include pressure sensors. These pressure sensors may be placed on or near the battery cells or other battery system components. These pressure sensors may detect an increase in pressure in a battery cell and prevent further charging, discharging, or both, of their corresponding battery cells. These and other embodiments of the present invention may further include other types of sensors. These sensors may detect an event or condition and prevent further charging, discharging, or both, of their corresponding battery cell or cells.

These and other embodiments of the present invention may provide other circuit configurations. For example, a gas gauge may be used for each battery cell. Software or hardware may be needed to combine the individual readings from each gas gauge to readings for the battery pack as a whole.

In these and other embodiments of the present invention, a gas gauge may be used for the battery pack. Each battery cell may have individual protection circuit to measure over-voltage, over-current, and excess temperature conditions. A sense resistor for each battery cell may further be coupled to a corresponding current sense circuit such that the current into and out of each battery cell may be measured.

Embodiments of the present invention may provide battery packs and battery systems that may be located in various types of devices, such as portable computing devices, tablet computers, desktop computers, laptops, all-in-one computers, wearable computing devices, cell phones, smart phones, media phones, storage devices, portable media players, navigation systems, monitors, power supplies, video delivery systems, remote control devices, chargers, and other devices that have been developed, are being developed, or will be developed in the future.

Various embodiments of the present invention may incorporate one or more of these and the other features described herein. A better understanding of the nature and advantages of the present invention may be gained by reference to the following detailed description and the accompanying drawings.

DESCRIPTION OF ILLUSTRATIVE EMBODIMENTS

Figure 1:
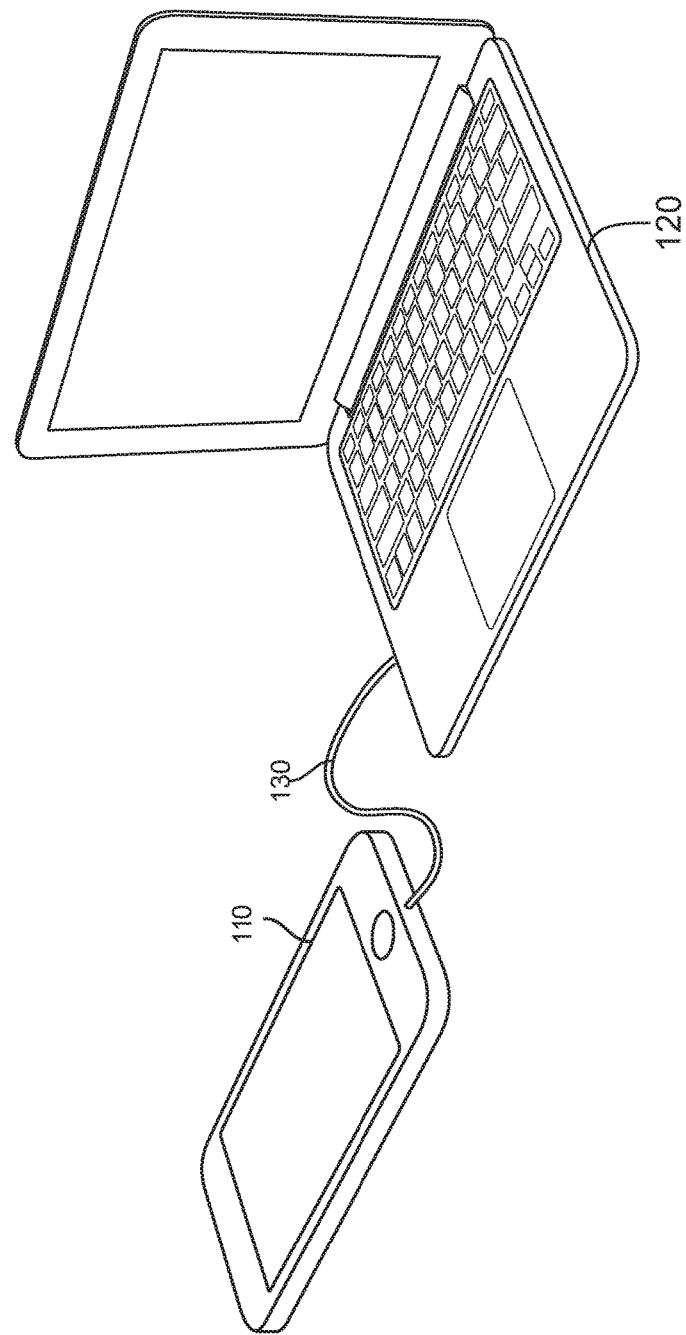
FIG. 1 illustrates an electronic system that may be improved by the incorporation of embodiments of the present invention.

FIG. 1 illustrates an electronic system that may be improved by the incorporation of an embodiment of the present invention. This figure, as with the other included figures, is shown for illustrative purposes and does not limit either the possible embodiments of the present invention or the claims.

This figure includes portable computing devices 110 and 120. Portable computing device 110 may be a laptop, notebook, tablet, smart phone, or other type of portable computing device. Portable computing device 120 may be a laptop, notebook, tablet, smart phone, or other type of portable computing device. In this example, portable computing device 120 may provide power over cable 130 to portable computing device 110. Portable computer device 110 and portable computing device 120 may share data over cable 130. In these and other embodiments of the present invention, portable computing device 110 and portable computing device 120 may be other types of devices such as desktop computers, laptops, all-in-one computers, wearable computing devices, cell phones, smart phones, media phones, storage devices, portable media players, navigation systems, monitors, power supplies, video delivery systems, remote control devices, chargers, and other devices that have been developed, are being developed, or will be developed in the future.

Portable computing device 110 may receive power over cable 130 from portable computing device 120 or other power source, such as an adapter. Portable computing device 110 may be arranged to have a desirable form factor. For example, portable computing device 110 may be relatively thin. Such a desired form factor may place a premium on space inside portable computing device 110. As a result, battery power for portable computing device 110 may be provided by two or more individual battery cells. These battery cells may have different capacities, form factors, sizes, or other characteristics. Accordingly, embodiments of the present invention may provide battery packs that may include and may monitor multiple battery cells using a reduced amount of circuitry. These and other embodiments of the present invention may further provide battery systems that may account for battery cell changes over aging and temperature.

Figure 2:
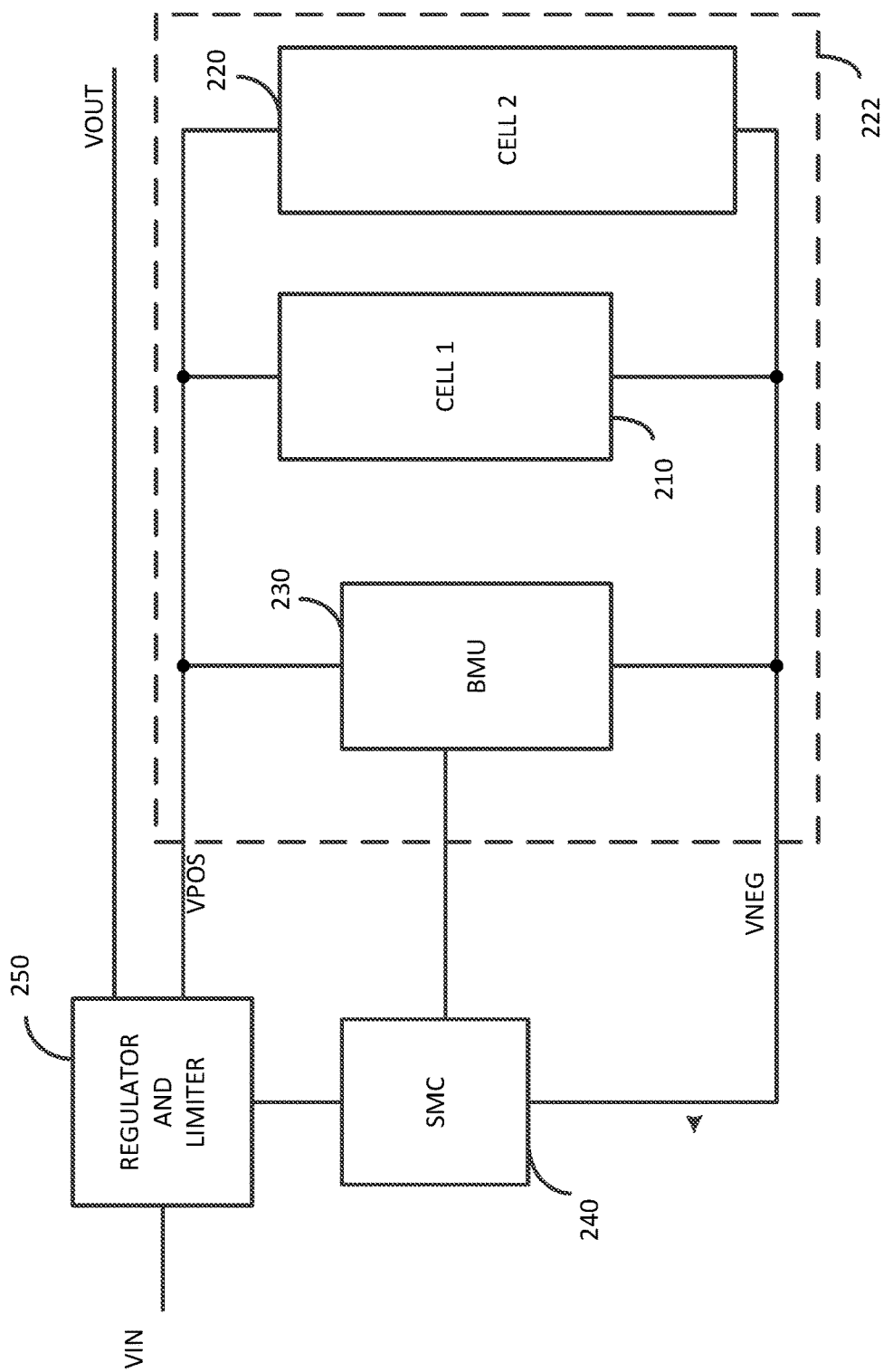
FIG. 2 illustrates a battery system for an electronic device according to an embodiment of the present invention.

FIG. 2 illustrates a battery system for an electronic device according to an embodiment of the present invention. This example may include a battery pack 222 having two battery cells, battery cell 1 210 and battery cell 2 220. Again, battery cell 1 210 may be different in size from battery cell 2 220. Specifically, these battery cells may have different capacities, form factors, physical sizes, or other characteristics. Battery pack 222 may be controlled by battery management unit 230. Battery management unit 230 may measure various aspects of battery cell 1 210 and battery cell 2 220, such as battery cell voltages and currents. Battery management unit 230 may provide information to a system microcontroller 240. System microcontroller 240 may in turn provide instructions to regulator and limiter 250.

An input voltage may be received by an electronic device on line VIN from an external host device, adapter, or other source. Regulator and limiter 250 may provide a regulated output voltage VOUT, such as 5 Volts, to circuitry (not shown) in the electronic device. Regulator and limiter 250 may also provide a regulated output voltage, such as 4.735 Volts, on line VPOS to the remainder of the battery system. Regulator and limiter 250 may provide the voltage VPOS with a fixed current, such as 500 mA. Battery management unit 230 may control the amount of current that is provided to battery pack 222 by sending information to system microcontroller 240. System microcontroller 240 may in turn control regulator and limiter 250. For example, system microcontroller 240 may control the voltage and available current provided by regulator and limiter 250.

Figure 3:
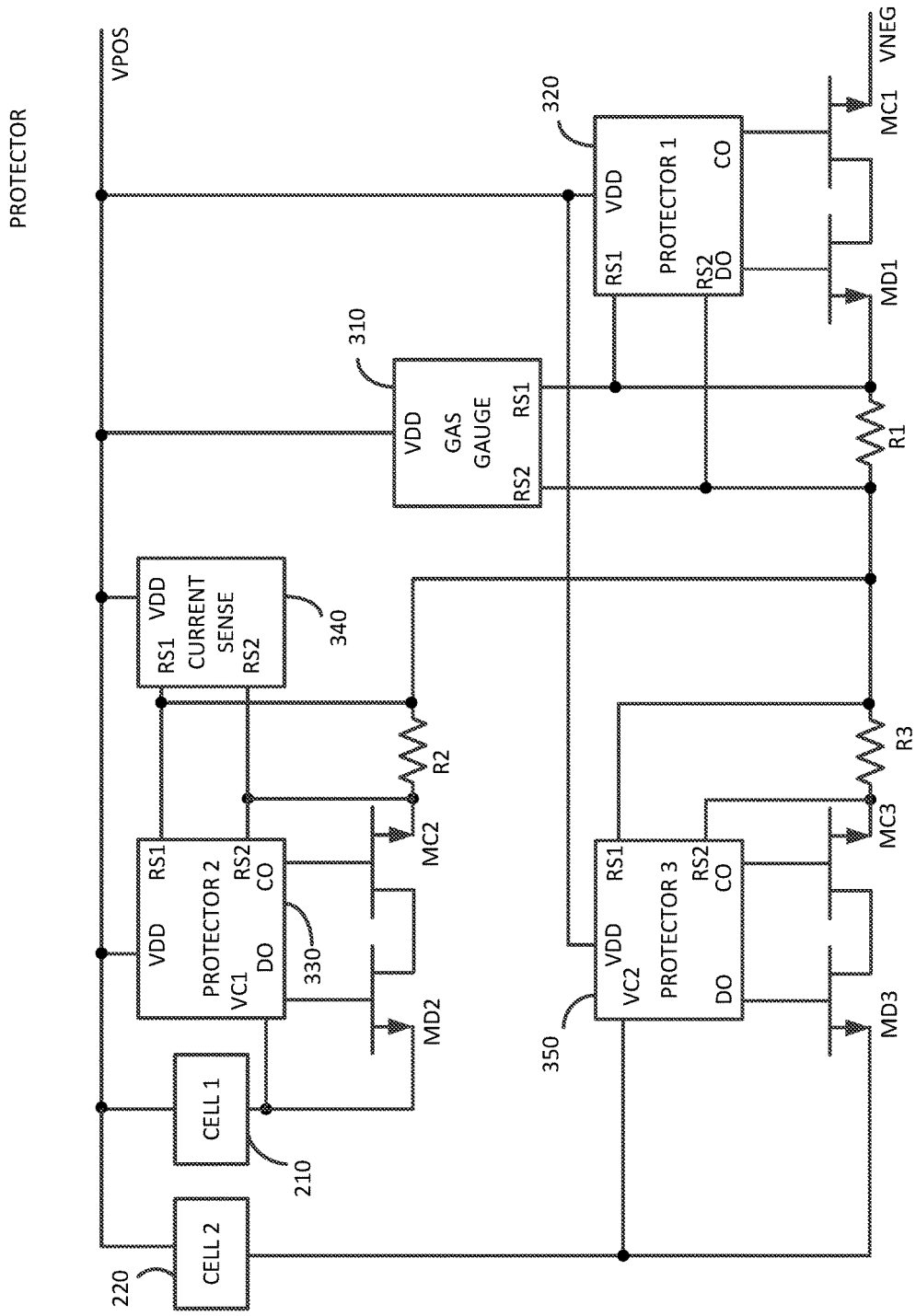
FIG. 3 illustrates a battery pack for an electronic device according to an embodiment of the present invention.

FIG. 3 illustrates a battery pack for an electronic device according to an embodiment of the present invention. This figure may include battery cells 210 and 220, as well as circuitry for battery management unit 230 as shown in FIG. 2. The battery management unit circuitry may include gas gauge 310 (also known as a fuel gauge), which is connected in common with both battery cells 210 and 220 and a current sense circuit 340 coupled to the battery cell 1 210. Gas gauge 310 may monitor current into and out of the combination of battery cells 210 and 220, as well as the voltage across them. Current sense circuit 340 may sense a current into or out of battery cell 1 210.

A protector circuit may be associated with each battery cell. Specifically, protector 2 330 may protect battery cell 1 210, while protector 3 350 may protect battery cell 2 220. Protector 1 320 may be in series with both battery cells 210 and 220. Each protector, protector 1 320, protector 2 330, or protector 3 350, may control discharge and charge transistors in series with one or both battery cells. When an over-voltage, over-current, excess temperature, or other fault condition is detected, a protector may drive a charge or discharge transistor into an open state to prevent further charging, discharging, or both, as appropriate.

In general, the number of current sense circuits (including gas gauges) used in this architecture may be one less than a total number of battery cells. Specifically, a gas gauge or current sense circuit may measure a total current into a battery pack. Individual current sense measurements may be taken for each battery cell, except one. The current into that battery cell may be calculated by subtracting the currents into the other individual battery cells from the combined total. In a battery pack having N battery cells, a current sense circuit may be placed in series with N−1 battery cells, while no current sense circuit is used for the Nth battery. The total current into the N battery cells can be read from the gas gauge, and the current into the N−1 battery cell can be read individually from the current sense circuits and subtracted from the total, such that the current into the Nth battery cell is the remainder.

In this particular example, gas gauge 310 may measure a combined current into battery cell 1 210 and battery cell 2 220. Current sense circuit 340 may measure a current into battery cell 1 210. The difference between these currents may be calculated, where the result is the net current into battery cell 2 220.

In this example, a current in or out of a battery cell may be calculated by measuring a voltage across a sense resistor. Specifically, gas gauge 310 may measure a voltage across R1. Since the resistance of R1 is known, a current into the battery cells 210 and 220 may be determined. Similarly, current sense circuit 340 may measure a voltage across resistor R2. Since the resistance of R2 is known, a current into or out of battery cell 1 210 may be calculated. A difference between these currents is the current into battery cell 2 220.

In this example, a single gas gauge 310 and a single current sense circuit 340 are used to implement the battery management unit functions for a multiple battery cell pack. This may be in contrast to conventional battery packs where each battery pack includes a single battery cell monitored by its own gas gauge, which in this case would require the inclusion of two complete gas gauges.

Accordingly, currents into or out of battery cells 210 and 220 may be monitored with a reduced amount of circuitry. Reducing the amount of circuitry need to perform these functions may save power and limit resource usage.

In various embodiments of the present invention, these currents may be compared to limits to determine if either of the battery cells is receiving excessive charging current or is being excessively discharged. An example is shown in the following flowchart.

Figure 4:
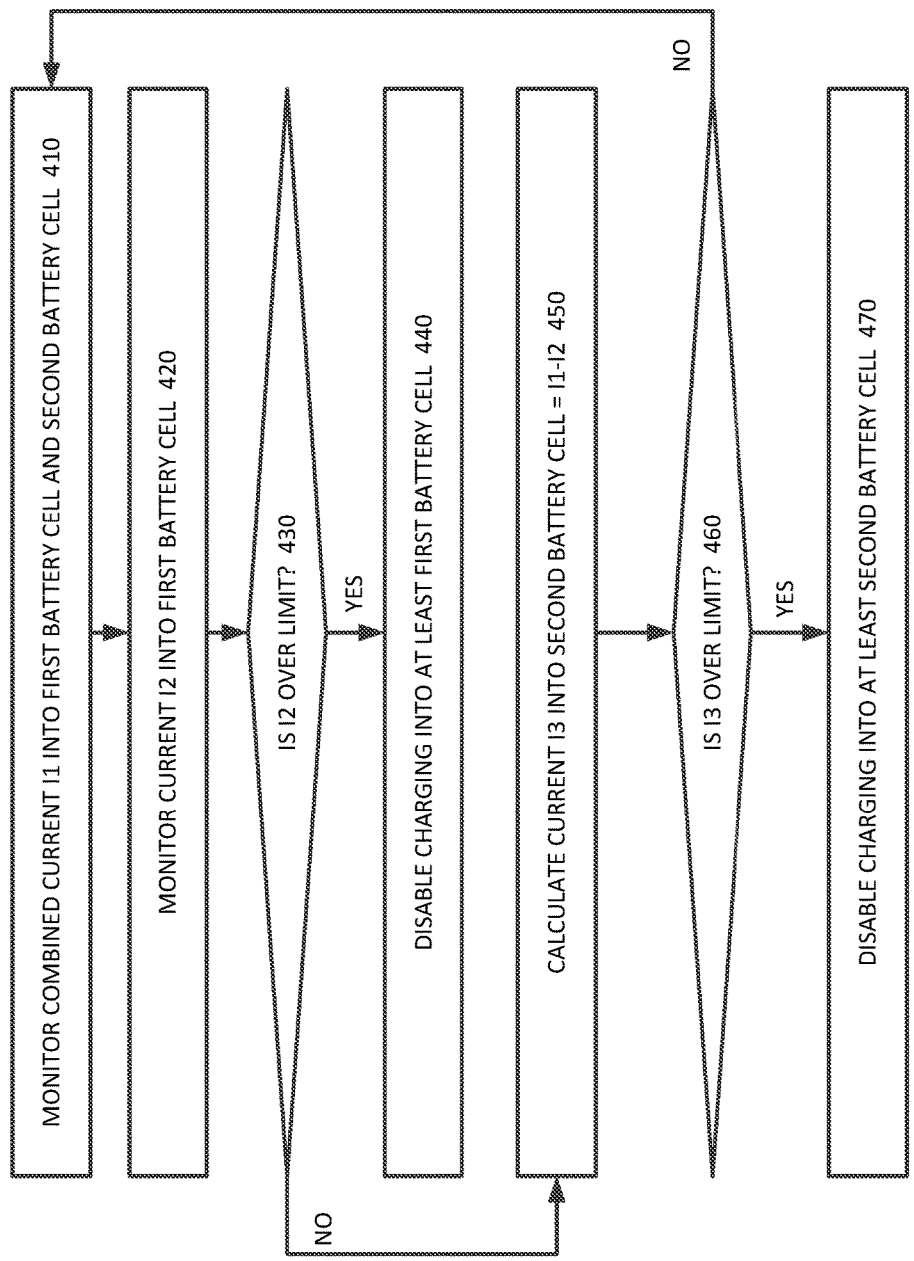
FIG. 4 is a flowchart illustrating a method of protecting battery cells according to an embodiment of the present invention.

FIG. 4 is a flowchart illustrating a method of protecting battery cells according to an embodiment of the present invention. It should be noted that this method may be combined with, or may supplement protection provided by protection circuits, such as the protection circuits in FIG. 3.

A combined current I1 into a first battery cell and second battery cell may be measured in act 410. In act 420, current I2 into a first battery cell may be measured. In act 430, it may be determined if this second current to the first battery cell is over a limit. If it is, then charging into the first battery cell may be disabled in act 440. In act 450, a third current into a second battery cell may be calculated. This may be done by taking a difference of the first two currents. As before, the third current may be compared to a limit in act 460, and if it is over that limit, charging into the second battery cell may be disabled in act 470. Again, battery cell 1 210 and battery cell 2 220 may have different over-current limits.

While this flowchart outlines protection against over-current conditions, a similar flowchart may outline protection against under-current conditions. For example, in act 430, it may be determined if I2 is under a limit, and if it is, discharging out of the first battery cell may be disabled in act 440. Similarly, the third current I3 may be compared to a limit in act 460 and if it is under that limit, discharging out of the second battery cell may be disabled in act 470. Again, measuring currents using a reduced amount of circuitry may provide protection for individual battery cells as well as a battery pack. This may save power and help to conserve resources.

These and other embodiments of the present invention may employ various algorithms while charging battery cells. These various algorithms may be modified by considering various factors in order to further one or more particular goals. For example, these and other embodiments of the present invention may attempt to maintain a particular charging time as a battery cell ages. These and other embodiments of the present invention may further help to conserve resources by protecting individual battery cells from conditions that would otherwise shorten their usable life.

These and other embodiments of the present invention may consider various factors in modifying the charging algorithms. For example, temperature, pressure, cycling information, and other data may be factors that are considered. These and other embodiments of the present invention may further consider an impedance of a battery cell when modifying the charging algorithms.

These and other embodiments of the present invention may dynamically determine or calculate an impedance of one or more of the battery cells in a battery pack. By comparing a determined or calculated impedance to an expected impedance for a battery cell, steps may be taken to pursue one or more goals. Also, by comparing a calculated impedance to the expected impedance for a battery cell, a user may be notified when a battery cell should be replaced and remaining battery cells may be protected when one or more battery cells are disconnected. Examples of how battery cell impedances may be determined are shown in the following figures.

Figure 5:
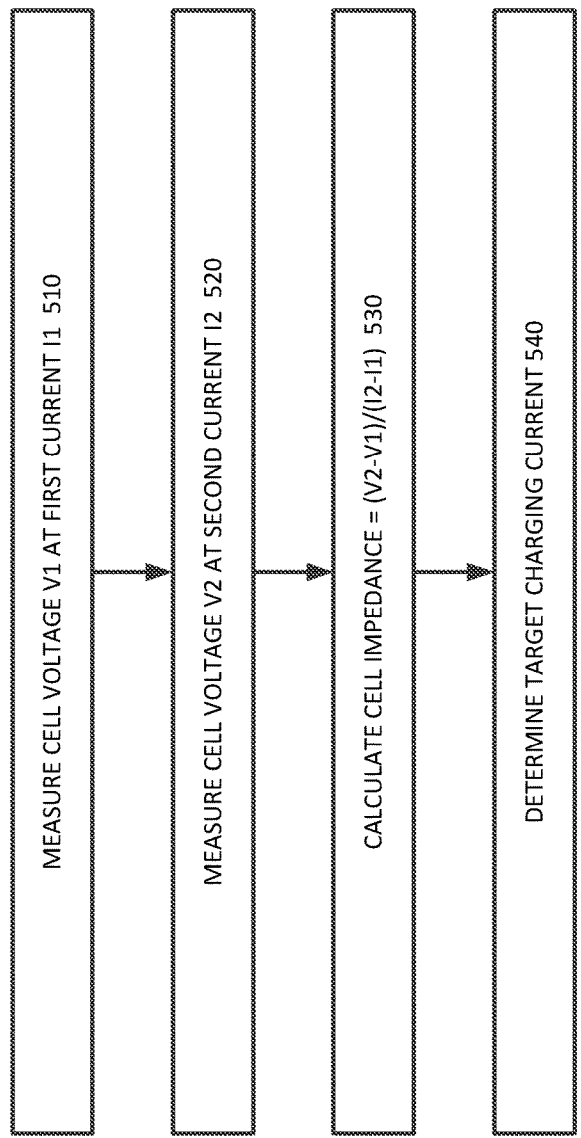
FIG. 5 is a flowchart of a method of measuring a battery cell impedance according to an embodiment of the present invention.

FIG. 5 is a flowchart of a method of measuring a battery cell impedance according to an embodiment of the present invention. In act 510, a first voltage V1 at a first battery cell may be measured at a first current I1. A second voltage V2 at the first battery cell may then be measured at a second current I2 in act 520. The battery cell impedance may be calculated by dividing the difference in the first and second voltages V1 and V2 by the difference in the first and second currents in act 530. Once the impedance is known, an algorithm may be modified and a target charging current may be determined.

Figure 6:
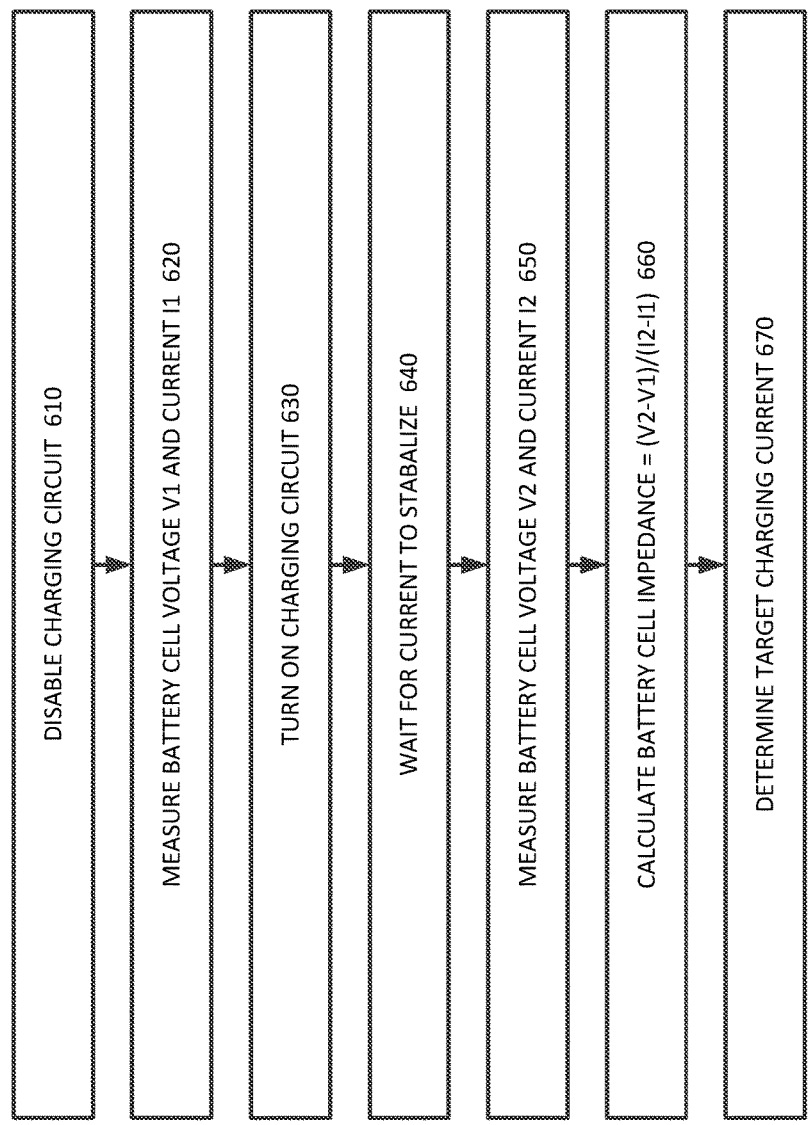
FIG. 6 is another flowchart of a method of measuring a battery cell impedance according to an embodiment of the present invention.

FIG. 6 is another flowchart of a method of measuring a battery cell impedance according to an embodiment of the present invention. In act 610, a charging circuit may be disabled. This should nominally prevent current flow into the battery cells. In act 620, the battery cell voltage V1 and any residual current I1 may be measured. In act 630, a charging circuit may be turned on and that charging current may be provided to the battery cells. A duration where in the current may stabilize may be passed in act 640. A new or second battery cell voltage V2 at the new or second current I2 may be measured in act 650. The battery cell impedance may be calculated by dividing the difference in voltages V2 and V1 by the difference in current I2 and I1 in act 660. As before, this impedance may be used to modify a charging algorithm and determine a target charging current in act 670.

The impedances of battery cells 210 and 220 may be calculated in various ways using the circuitry shown in FIGS. 2 and 3. For example, a first voltage and a first current and a second voltage and a second current for the battery cell 1 210 may be measured by current sense circuit 340 and gas gauge 310 in FIG. 3. This may yield the impedance of battery cell 1 210. Similarly, a first voltage and a first current and a second voltage and a second current for the combined battery cells 210 and 220 may be measured by gas gauge 310 in FIG. 3. This may yield the parallel impedance of battery cell 1 210 and battery cell 2 220. Since the impedance of battery cell 1 210 is known, the impedance of battery cell 2 220 may be calculated. The impedance calculations may be performed by various logic or other circuits, such as the system microcontroller 240 in FIG. 2. Alternatively, currents into battery cell 2 220 may be determined by subtracting the combined current reading from gas gauge 310 from the reading for battery cell 1 210 measured by current sense circuit 340. The currents into battery cell 2 220 and the resulting voltages may then be used to calculate the impedance of battery cell 2 220 directly. Again, various circuits, such as the system microcontroller 240 in FIG. 2, may perform these calculations.

In the above example, a battery cell impedance may be calculated using a charging current. In these and other embodiments of the present invention, a discharging current may be used. In these and other embodiment of the present invention, both charging and discharging currents may be used, and a weighted average of the two measurements may be used.

Once a battery cell impedance has been calculated, it may be compared to an expected value. If the impedance value of a battery cell is much higher than expected, it may be that the battery cell has been disconnected by its protection circuit. Alternatively, battery cell tabs or other connections may become deteriorated or broken, which may also cause a battery cell impedance to be excessive. In these and other embodiments of the present invention, the battery system circuitry may respond to these conditions in various ways. Examples are shown in the following figures.

Figure 7:
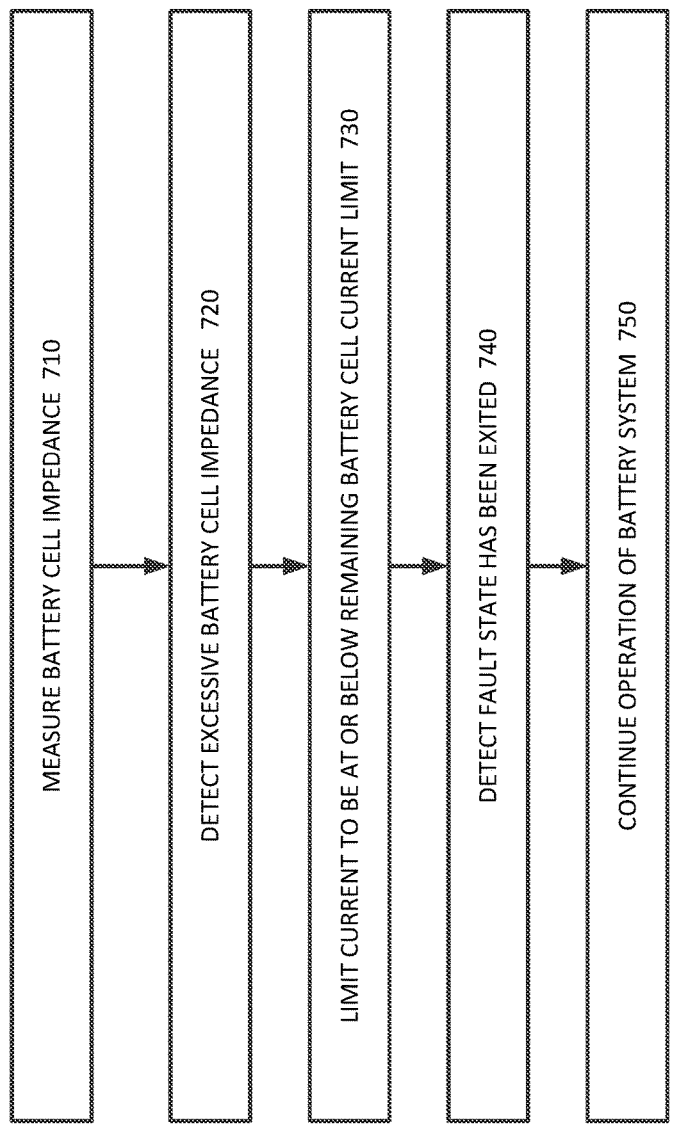
FIG. 7 illustrates a method of using an impedance measurement to determine that a fault state has occurred for a battery cell according to an embodiment of the present invention.

FIG. 7 illustrates a method of using an impedance measurement to determine that a fault state has occurred for a battery cell according to an embodiment of the present invention. In act 710, a battery cell impedance may be calculated, for example using one of the methods shown above. In act 720, the calculated impedance may be determined to be excessive. If this battery cell impedance is high enough, it may mean that the battery cell has become at least partially disconnected. Accordingly, in act 730, a current provided to the battery pack may be reduced to be at or below a current limit for the remaining battery cells. In act 740, it may be determined that the fault state has been exited. For example, it may be determined that the battery cell impedance has now been reduced. Once the fault state has been exited, operation of the battery circuit may continue in act 750.

In this example, a fault state may be entered following an over-voltage, over-current, or other fault condition. Typically, these fault states may be exited by reducing a charging voltage or current. At other times, a battery cell tab or other connection may become damaged or deteriorate, or other such condition may arise. These conditions may not be easily exited and may require repair or replacement of the battery pack. Accordingly, embodiments of the present invention may detect that a fault state has not been exited for first period of time, and a user may be notified regarding battery pack repair or replacement. An example is shown in the following figure.

Figure 8:
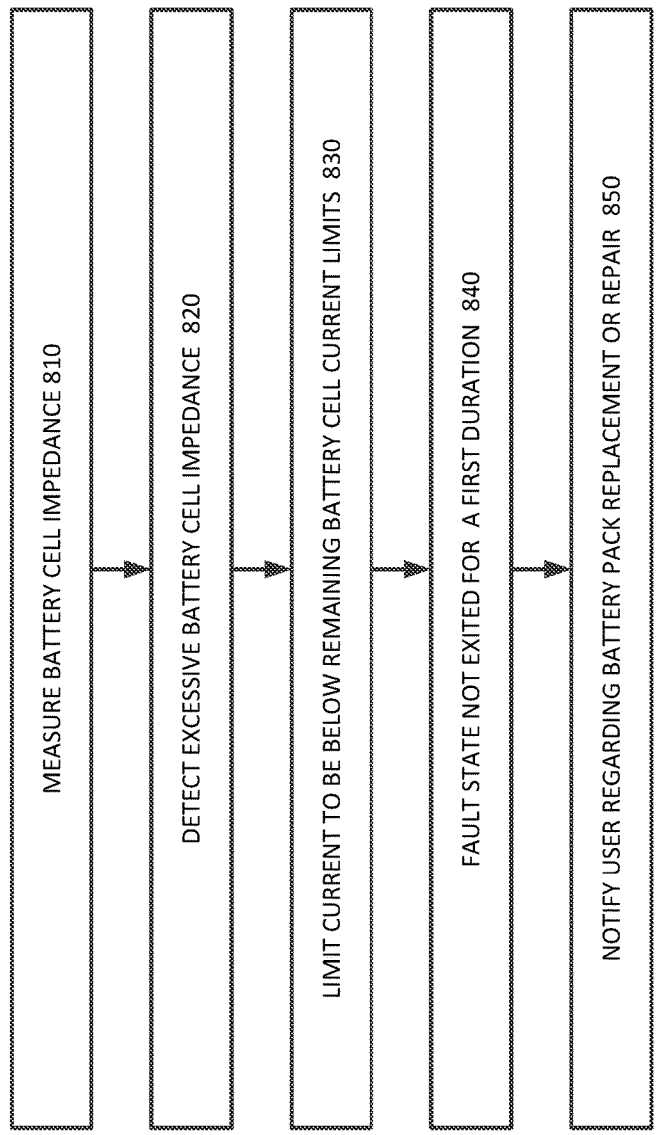
FIG. 8 illustrates a method of using battery cell impedance measurements to determine that a battery pack repair or replacement may be needed.

FIG. 8 illustrates a method of using battery cell impedance measurements to determine that a battery pack repair or replacement may be needed. In act 810, a battery cell impedance may be calculated. In act 820, it may be determined that this battery cell impedance is excessive. As before, the current into the battery pack may be reduced to a level is at or below the current limits of the remaining battery cells, in act 830. In act 840, it may be determined that the fault state is not been exited for a first period of time. Accordingly, a user may be notified regarding battery pack repair or replacement in act 850. This notification, as with the other notifications that may be provided by embodiments of the present invention, may be provided on a screen of an electronic device housing the battery pack, it may be provided by text or email, by status indication lights, or by other device or method.

Once a battery cell impedance is known, it may be compared to an expected impedance. This expected impedance may be a function of battery cell aging, total charge time, cycle time, temperature, pressure, or other battery cell characteristic. This comparison may be used to determine that a battery pack is, or is becoming, nonfunctional and should be replaced or repaired. This comparison may also be used to modify a charging algorithm to adjust charging currents and other charging parameters. Examples are shown in the following figures.

Figure 9:
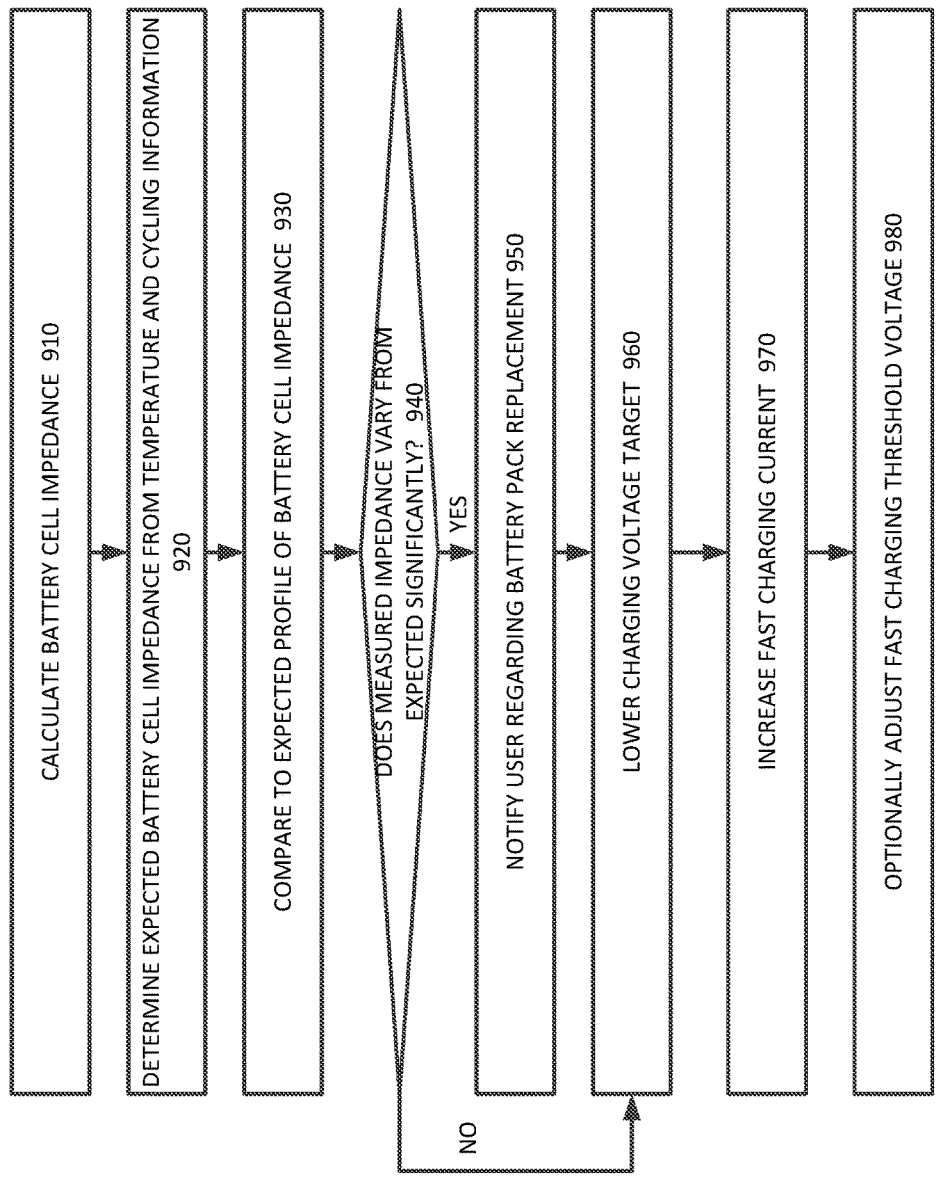
FIG. 9 illustrates a method of modifying a charging algorithm based on a calculated battery cell impedance according to an embodiment of the present invention.

FIG. 9 illustrates a method of modifying a charging algorithm based on a calculated battery cell impedance according to an embodiment of the present invention. In this method, an algorithm may be modified in order to maintain a battery charging time as a battery ages. In act 910, a battery cell impedance may be calculated. An expected battery cell impedance based on temperature and cycling information may be determined in act 920. This expected impedance may be determined based on cycling, temperature, and other data. The expected impedance may instead be read from a table or other database. These calculations or tables may be done by or stored in various circuits such as the system microcontroller 240 in FIG. 2. The calculated and expected battery cell impedances may be compared in act 930. In act 940, it may be determined whether the calculated impedance varies significantly from the expected impedance. If it does, a user may be notified regarding a possible necessity of the battery pack being repaired or replaced in act 950. In any event, a charging voltage target may be lowered in act 960. Further, a fast charging current may be increased in act 970. These two acts in tandem may help to maintain battery cell charging time as a battery cell ages and its impedance increases. Optionally, a fast charging threshold voltage may be modified in act 980.

Again, charging algorithms may be varied based upon battery cell impedance measurements to achieve various goals. In the example above, a goal of maintaining battery charging time was pursued. In the following example, the goal may be to maximize battery lifetime.

Figure 10:
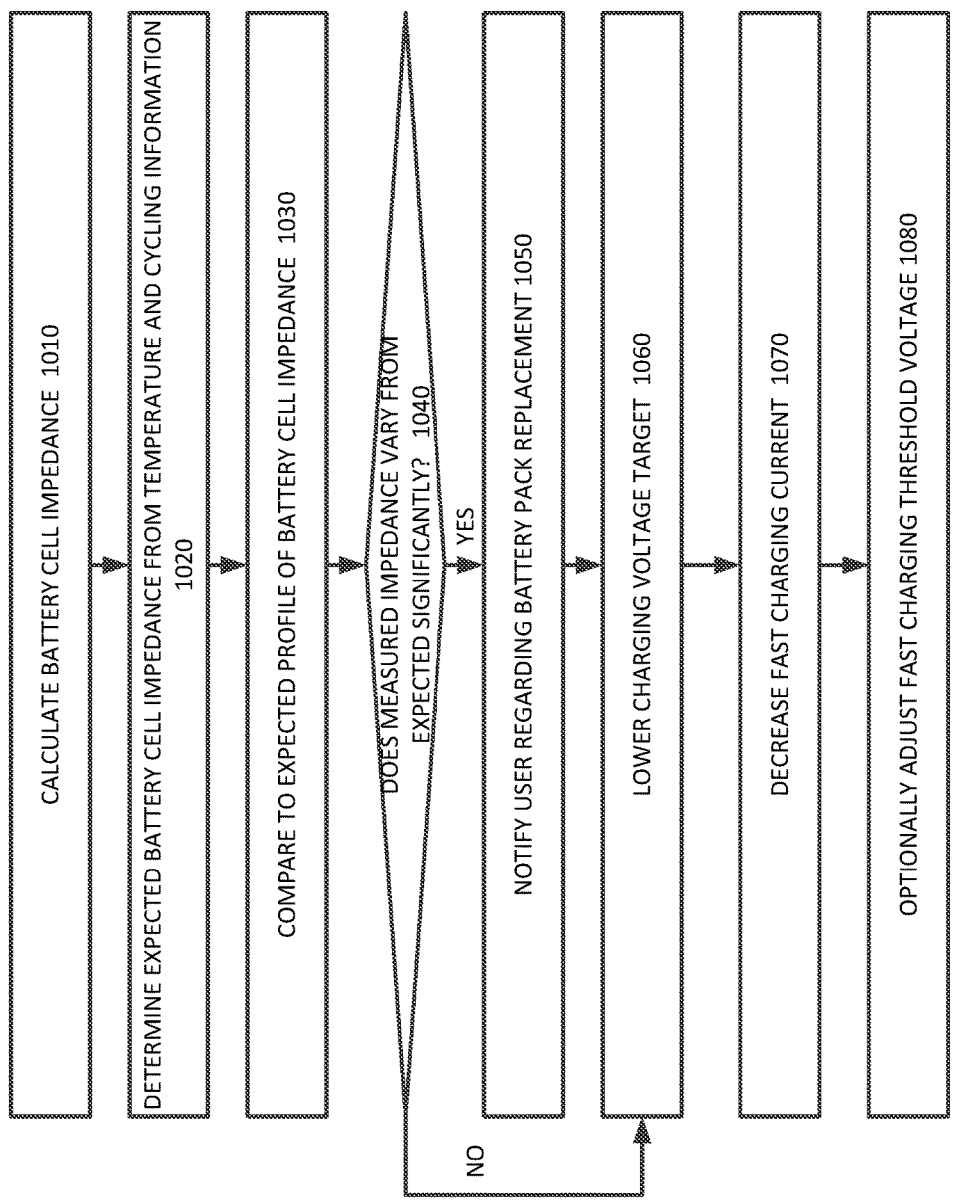
FIG. 10 illustrates another method of modifying a charging algorithm based on a calculated battery cell impedance according to an embodiment of the present invention.

FIG. 10 illustrates another method of modifying a charging algorithm based on a calculated battery cell impedance according to an embodiment of the present invention. In this method, an algorithm may be modified in order to maximize battery lifetime as a battery ages. In act 1010, a battery cell impedance may be calculated. An expected battery cell impedance based on temperature and cycling information may be determined in act 1020. This expected impedance may be determined based on cycling, temperature, and other data. The expected impedance may instead be read from a table or other database. Again, these calculations may be performed by, or the tables may be stored in, various circuits such as system microcontroller 240 in FIG. 4. The calculated and expected battery cell impedances may be compared in act 1030. In act 1040, it may be determined whether the calculated impedance varies significantly from the expected impedance. If it does, a user may be notified regarding a possible necessity of the battery pack being repaired or replaced in act 1050. In any event, a charging voltage target may be lowered in act 1060. Further, a fast charging current may be decreased in act 1070. These two acts in tandem may help to extend battery life as a battery cell ages and its impedance increases. Optionally, a fast charging threshold voltage may be modified in act 1080.

These and other embodiments of the present invention may provide other circuit configurations. For example, a gas gauge may be used for each battery cell in a battery pack. Software or hardware may be employed to combine the individual readings from each gas gauge to readings for the battery pack as a whole. An example is shown in the following figure.

Figure 11:
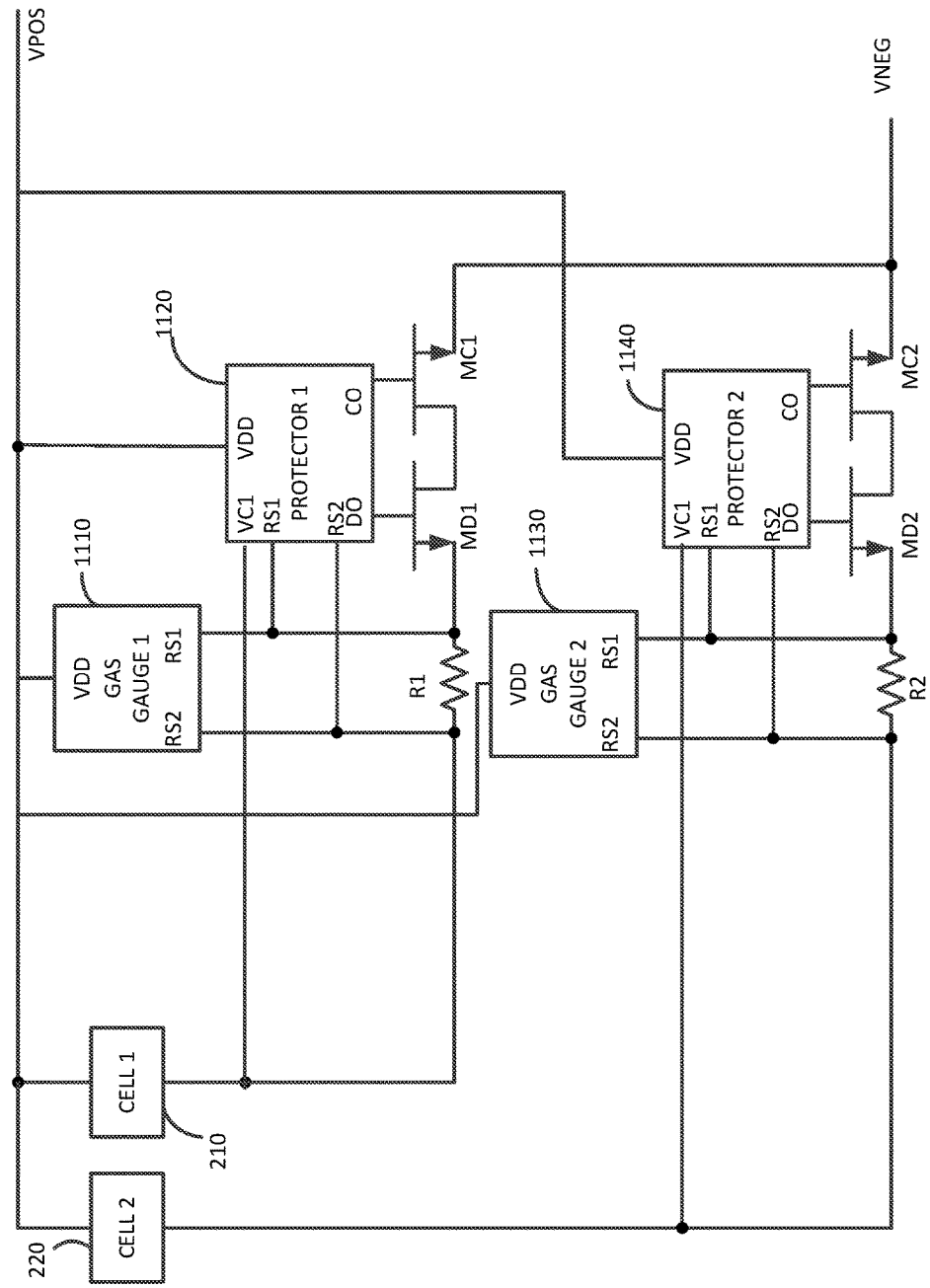
FIG. 11 illustrates another battery pack for an electronic device according to an embodiment of the present invention.

FIG. 11 illustrates another battery pack for an electronic device according to an embodiment of the present invention. This example may include two battery cells, battery cell 1 210 and battery cell 2 220. Each battery cell 210 and 220 may have its own gas gauge. Specifically, battery cell 1 210 may be monitored by gas gauge 1 1110 while battery cell 2 220 may be monitored by gas gauge 2 1130. Gas gauge 1 1110 may be connected across sense resistor R1, while gas gauge 2 1130 may be connected across sense resistor R2. Since the values of R1 and R2 are known (and not necessarily the same), by measuring a voltage across each sense resistor, the current into or out of each battery cell 210 and 220 may be determined. Each battery cell 210 and 220 may have positive terminals connected to each other and to a positive system terminal VPOS. Each battery cell 210 and 220 may have a negative terminal connected to a control path, and the other ends of which are connected to a negative system terminal VNEG.

As before, each control path may include a discharge transistor, a charge transistor, and a series resistance. The charge transistor and discharge transistors may have control electrodes driven by protection circuits. Specifically, protector 1 1120 may drive discharge and charge transistors in series with battery cell 1 210, while protector circuit 2 1140 may drive discharge and charge transistors in series with battery cell 2220.

The two gas gauges 1110 and 1130 may monitor current and voltage conditions for their respective battery cells 210 and 220. Gas gauges 1110 and 1130 may provide this information to a system microcontroller 240, as shown in FIG. 2. System microcontroller 240 may include software or hardware to determine a state of charge for battery cells 2 10 and 220. System microcontroller 240 may control regulator and limiter 250 to adjust the amount of current and the voltage provided to battery cells 210 and 220. Gas gauges 1110 and 1130 may provide the battery management function of battery management unit 230 in FIG. 2.

It should be noted that even though two gas gauges 1110 and 1130 are used, gas gauges 1110 and 1130 may be simplified as compared to convention gas gauges. For example, some or all of the processing typically performed by a gas gauge may be offloaded to system microcontroller 240 as shown in FIG. 2. By allowing the use of simplified gas gauges 1110 and 1130, these and other embodiments of the present invention may save power and preserve resources.

In these and other embodiments of the present invention, a single gas gauge may be used for a battery pack. Each battery cell in the battery pack may have individual protection circuit to measure over-voltage, over-current, and excess temperature conditions. A sense resistor for each battery cell may further be coupled to a current sense circuit such that the current into and out of each battery cell may be measured. An example is shown in the following figure.

Figure 12:
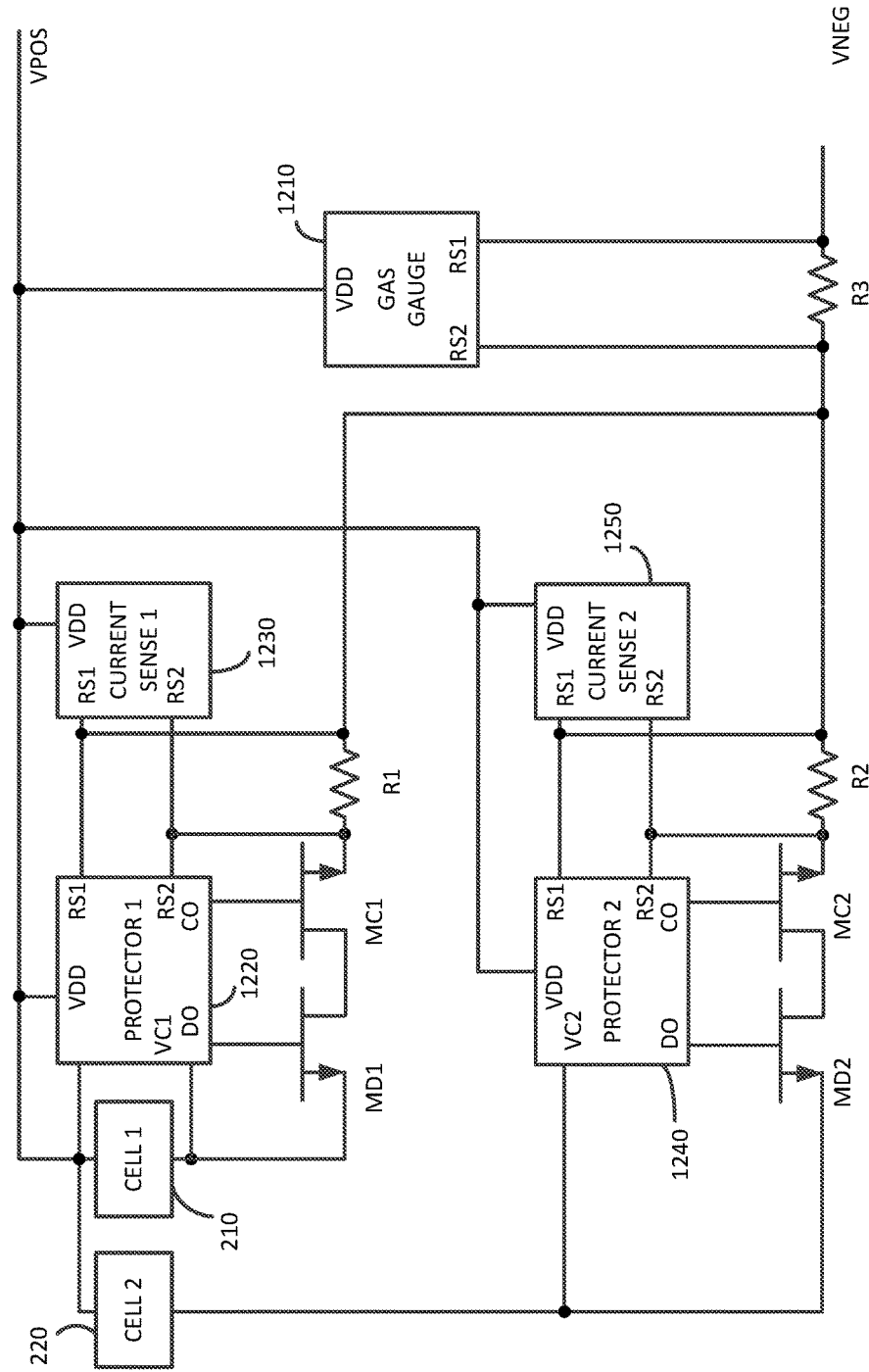
FIG. 12 illustrates another battery pack for an electronic device according to an embodiment of the present invention.

FIG. 12 illustrates another battery pack for an electronic device according to an embodiment of the present invention. This example may include two battery cells, battery cell 1 210 and battery cell 2 220. As before, each battery cell may have a terminal coupled to a control path including a discharge transistor, charge transistor, and sense resistor. Protection circuits may drive electrodes of the discharge and charge transistors. Specifically, protector 1 1220 may drive control electrodes for discharge and charge transistors in a control path coupled in series with battery cell 1 210. Protector 2 1240 may drive discharge and charge transistors in a control path in series with battery cell 2 220.

Current into or out of each battery cell 210 and 220 may be monitored by individual current sense circuits. For example, current sense circuit 112 30 may monitor current into and out of battery cell 1 210 by measuring a voltage across a known resistor R1. Similarly, current sense circuit 2 1250 may monitor current into and out of battery cell 2 220 by measuring a voltage across a known resistor R2.

Gas gauge 1210 may be placed in series with both battery cells 210 and 220 to monitor current into and out of the battery pack. Gas gauge 1210 may send current and voltage information to system microcontroller 240, as shown in FIG. 2. System microcontroller 240 may determine the state of charge for battery cells 210 and 220. System microcontroller 240 may control regulator and limiter 250 to adjust an amount of current and voltage provided to battery cells 210 and 220. In this example, gas gauge 1210 and current sense circuits 1230 and 1250 may perform the functions of the battery management unit 230 in FIG. 2.

These and other embodiments of the present invention may further include temperature sensors either in or related to the protection circuits or the gas gauge. These temperature sensors may be placed on or near the battery cells or other battery system components. These temperature sensors may detect excessive temperatures (either high or low, or both) and prevent further charging, discharging, or both of their corresponding battery cells until temperatures return to an acceptable range.

These and other embodiments of the present invention may further include pressure sensors. These pressure sensors may be placed on or near the battery cells or other battery system components. These pressure sensors may detect an increase in pressure in a battery cell and prevent further charging, discharging, or both, of their corresponding battery cells. These and other embodiments of the present invention may further include other types of sensors. These sensors may detect an event or condition and prevent further charging, discharging, or both, of their corresponding battery cell or cells.

In the above examples, battery packs having two battery cells have been shown. In these and other embodiments of the present invention, battery packs may include three, four, or more battery cells. Each of these battery cells may be controlled by a control path that may be the same or similar to the control paths shown in the above examples. The control electrodes or gates of the charge and discharge transistors in each of these control paths may be controlled by one or more protection circuits.

In the above examples, charge transistors and discharge transistors are shown as N-channel field effect transistors. In these and other embodiments of the present invention, one or more of these charge and discharge transistors may be implemented as P-channel field effect transistors, bipolar, or other types of transistors. Also, while their body diodes employed, in these and other embodiments of the present invention, the body diodes may be replaced by actual diodes. These diodes may be P-N diodes, they may be Schottky diodes, or they may be other types of diodes. These diodes and transistors may be at least partially formed on an integrated circuit that also forms at least part of a battery controller, or they may be separate components.

In these examples, the control paths including sense resistors, discharge transistors, and charge transistors, may be connected between a negative terminal of a battery cell and a gas gauge and protection circuit. In these and other embodiments of the present invention, one or more control paths may be connected between a positive terminal of a battery cell and a gas gauge and protection circuit. Also, while components in the control paths, specifically the sense resistors, discharge transistors, and charge transistors, are shown as being connected in a specific sequence, these components may be connected in different sequences in one or more of the control paths.

Embodiments of the present invention may provide battery packs and battery systems that may be located in various types of devices, such as portable computing devices, tablet computers, desktop computers, laptops, all-in-one computers, wearable computing devices, cell phones, smart phones, media phones, storage devices, portable media players, navigation systems, monitors, power supplies, video delivery systems, remote control devices, chargers, and other devices that have been developed, are being developed, or will be developed in the future.

The above description of embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. Thus, it will be appreciated that the invention is intended to cover all modifications and equivalents within the scope of the following claims.

What is claimed is:

1. An electronic device comprising:
    a battery pack comprising:
        a first battery cell having a first terminal and a second terminal;
        a second battery cell having a first terminal and a second terminal, the first terminal of the second battery cell coupled to the first terminal of the first battery cell;
        a first protection circuit having a first terminal coupled to the second terminal of the first battery cell;
        a second protection circuit having a first terminal coupled to the second terminal of the second battery cell;
        a first current sense circuit coupled to the first battery cell to sense a current through the first battery cell; and
        a gas gauge coupled in series with the first battery cell and the second battery cell to measure a current through the combination of the first battery cell and the second battery cell and to measure a voltage across the first battery cell and the second battery cell.

2. The electronic device of claim 1 wherein the first battery cell has a first charge capacity and the second battery cell has a second charge capacity, the first charge capacity different from the second charge capacity.

3. The electronic device of claim 2 wherein the battery pack further comprises:
    a first resistor coupled to the second terminal of the first battery cell, where the first current sense circuit is coupled across the first resistor; and
    a second resistor coupled to the second terminal of the first battery cell and the second terminal of the second battery cell, where a second current sense circuit is coupled across the second resistor.

4. The electronic device of claim 3 wherein the second current sense circuit is included in an integrated circuit having the gas gauge, where the gas gauge calculates a combined charge of the first battery cell and the second battery cell.

5. The electronic device of claim 4 wherein the integrated circuit further comprises an over-voltage protection circuit.

6. The electronic device of claim 2 further comprising:
    a system microcontroller to calculate an impedance of the first battery cell and an impedance of the second battery cell.

7. The electronic device of claim 6 wherein the system microcontroller calculates the impedance of the first battery cell by receiving a first voltage of the first battery cell as a first current flows in the first battery cell, receiving a second voltage of the first battery cell as a second current flows in the first battery cell, and dividing the difference between the second voltage and the first voltage by the difference between the second current and the first current.

8. The electronic device of claim 7 wherein the system microcontroller calculates the impedance of the second battery cell by calculating the parallel impedance of the first battery cell and the second battery cell, then using the parallel impedance of the first battery cell and the second battery cell and the impedance of the first battery cell to calculate the impedance of the second battery cell.

9. The electronic device of claim 6 wherein the system microcontroller controls a charging current into the first battery cell and the second battery cell based on the impedance of the first battery cell and the impedance of the second battery cell.

10. The electronic device of claim 6 wherein the system microcontroller is further configured to monitor changes in the impedance of the first battery cell and the impedance of the second battery cell, and to control a charging current into the first battery cell and the second battery cell based on the changes in the impedance of the first battery cell and the impedance of the second battery cell.

11. The electronic device of claim 6 wherein the system microcontroller is further configured to reduce a charging current into the first battery cell and the second battery cell in response to an absence of current flow in either the first battery cell or the second battery cell.

12. The electronic device of claim 11 wherein the system microcontroller is further configured to maintain the reduced charging current until a fault state has been exited.

13. The electronic device of claim 6 wherein the system microcontroller is further configured to monitor a number of times the first battery cell and the second battery cell have been charged, and wherein the system microcontroller reduces a charging current into the first battery cell and the second battery cell in response to the number of times the first battery cell and the second battery cell have been charged.

14. The electronic device of claim 6 wherein the system microcontroller is further configured to monitor a number of times the first battery cell and the second battery cell have been charged, and wherein the system microcontroller increases a charging current into the first battery cell and the second battery cell in response to the number of times the first battery cell and the second battery cell have been charged.

15. An electronic device comprising:
a battery pack comprising:
a first battery cell having a first terminal and a second terminal;
a second battery cell having a first terminal and a second terminal, the first terminal of the second battery cell coupled to the first terminal of the first battery cell;
a first protection circuit coupled to the second terminal of the first battery cell;
a second protection circuit coupled to the second terminal of the second battery cell; and
first measurement circuitry to measure a first current into the first battery cell and a resulting first voltage and a second current into the first battery cell and a resulting second voltage; and
first logic circuitry to calculate an impedance of the first battery cell by dividing the difference between the resulting second voltage and the resulting first voltage by the difference between the first current and the second current.

16. The electronic device of claim 15 wherein the first measurement circuitry includes a gas gauge coupled to the first protection circuit and the second protection circuit.

17. The electronic device of claim 16 wherein the first logic circuitry is included in a system microcontroller.

18. The electronic device of claim 15 wherein the calculated impedance of the first battery cell is used in modifying a charging algorithm for the first battery cell and the second battery cell.

19. The electronic device of claim 18 wherein as the calculated impedance of the first battery cell increases, the charging algorithm is modified to provide a higher fast charging current.

20. The electronic device of claim 18 wherein as the calculated impedance of the first battery cell increases, the charging algorithm is modified to provide a lower fast charging current.

* * * * *